United States Patent [19]
Hietala et al.

[11] Patent Number: 4,851,798
[45] Date of Patent: Jul. 25, 1989

[54] UNITARY TUNING STRUCTURE

[75] Inventors: Alexander W. Hietala, Schaumburg, Ill.; Max W. Muterspaugh, Indianapolis, Ind.

[73] Assignee: RCA Licensing Corporation, Princeton, N.J.

[21] Appl. No.: 175,898

[22] Filed: Mar. 31, 1988

[51] Int. Cl.[4] .............................. H03J 3/20
[52] U.S. Cl. ........................ 334/66; 334/71; 334/78; 336/20
[58] Field of Search ............... 334/61, 65, 66, 71, 334/78, 80, 82; 333/185; 336/20, 232

[56] References Cited

U.S. PATENT DOCUMENTS

| | | | |
|---|---|---|---|
| 2,880,400 | 3/1959 | Tollefson | 334/71 X |
| 3,422,379 | 1/1969 | Granqvist | 334/61 X |
| 4,048,597 | 9/1977 | Knight et al. | 334/71 X |
| 4,467,393 | 8/1984 | Kupfer | 334/80 X |
| 4,485,382 | 11/1984 | Moore | 334/71 X |

OTHER PUBLICATIONS

Matsushita TNV-56452G2 Tuner used in Quasar TL9982 television receiver believed to be on sale in U.S. in 1987.

Primary Examiner—Paul Gensler
Attorney, Agent, or Firm—Eugene M. Whitacre; Paul J. Rasmussen; Peter M. Emanuel

[57] ABSTRACT

A unitary tuning structure of a UHF tuner includes an inductance loop, an inductance adjustment element attached to a top portion of the inductance loop so as to be foldable with respect to the inductance loop about an axis parallel to the printed circuit board to which the inductance loop is attached and a capacitance adjustment tab attached to a side portion of the inductance loop so as to be foldable with respect to the inductance loop about an axis perpendicular to the printed circuit board. In another form of the unitary tuning structure, a second inductance loop can be attached within the first loop.

10 Claims, 4 Drawing Sheets

UNITARY TUNING STRUCTURE

FIELD OF THE INVENTION

The present invention concerns a unitary tuning structure stamped from sheet metal as may be employed in the UHF section of a tuner of a television receiver.

BACKGROUND OF THE INVENTION

A unitary tuning structure, including an inductance loop, an inductance adjustment element and a capacitance adjustment element integrally attached together, are desirable since they can be inexpensively produced by stamping sheet metal and replace separate components which require individual manufacture and installation. However, prior unitary tuning structures, to be described below in detail, require several folds or bends, take up a relatively large amount of space on a printed circuit board, and tend to be susceptible to produce tuning fluctuations due to relative motion between the various components under conditions of vibration.

SUMMARY OF THE INVENTION

In accordance with the invention, the preferred form of an improved unitary tuning structure, including at least an inductance loop and an inductance adjustment element, has the inductance adjustment element attached to a top portion of the inductance loop so as to be foldable with respect to the plane of the inductance loop about an axis which is substantially parallel to the circuit board to which the unitary structure is attached. A capacitance adjusting element can be attached, as an integral part of the unitary tuning structure, to a side of the inductance loop so as to be foldable with respect to the plane of the inductance loop about an axis which is substantially perpendicular to the circuit board. A second inductance loop, within the first, may be provided as another integral part of the unitary tuning structure and serve as an output signal coupling network.

BRIEF DESCRIPTION OF THE DRAWING

The present invention will be described with reference to the accompanying Drawing in which.

DETAILED DESCRIPTION OF THE DRAWING

Figure 1:
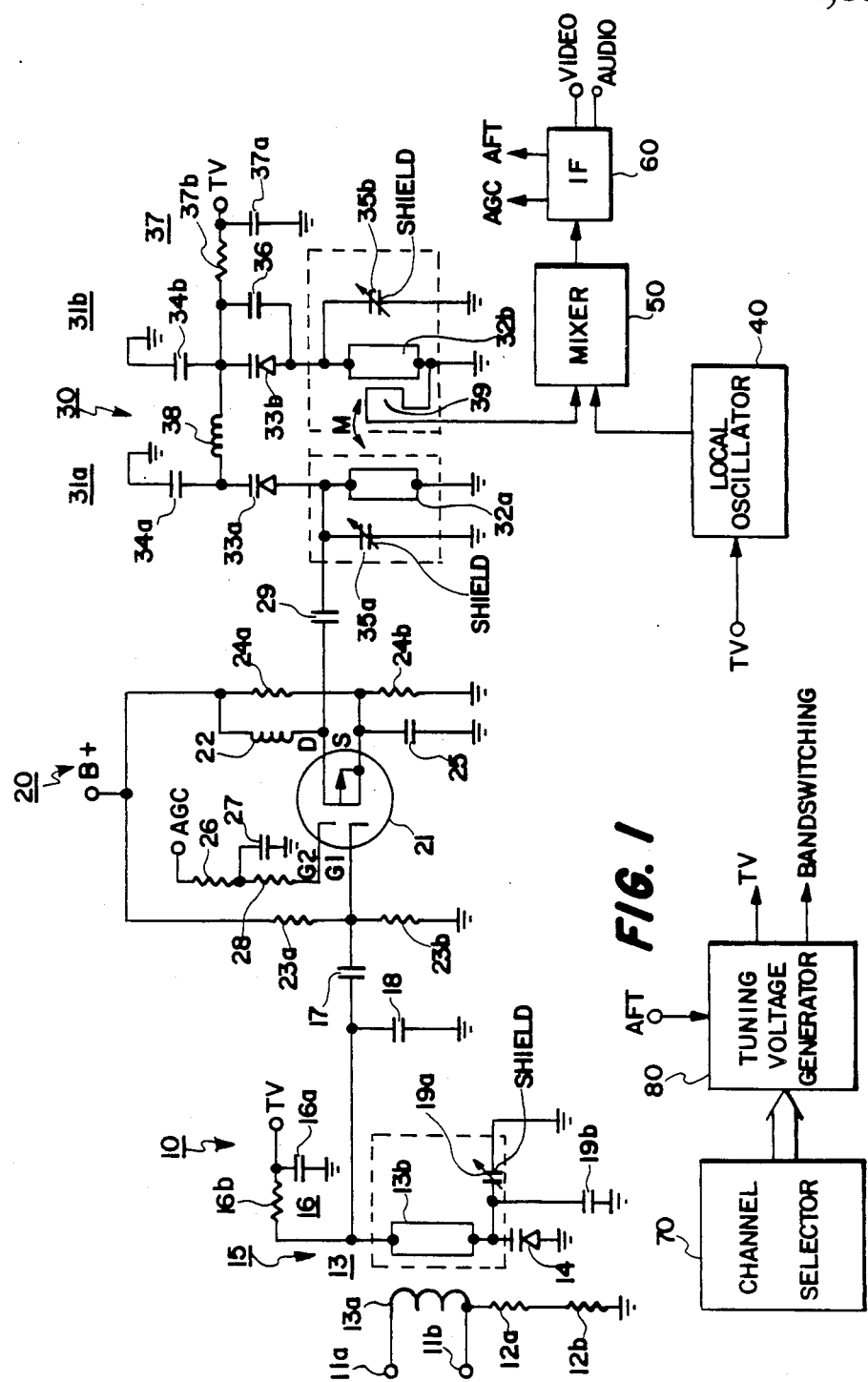
FIG. 1 is an electrical schematic diagram of a UHF tuner section of a television receiver which may employ the invention.

The UHF tuner section shown in FIG. 1 includes a tuned RF signal input circuit 10, an RF amplifier 20, a tuned RF signal output circuit 30, a local oscillator 40, a mixer 50 and an IF section 60 arranged in generally conventional fashion to produce an IF signal. RF input circuit 10, RF amplifier 20 and RF output circuit 30 cooperate to select and amplify the RF signal corresponding to the channel selected to be tuned from the plurality of RF signals received by an UHF antenna (not shown), but reject unwanted signals. Local oscillator 40 generates a local oscillator signal having a frequency set in accordance with the channel selected to be tuned. RF input circuit 10, RF output circuit 30 and local oscillator 40 include respective tuned circuits having frequency selective response controlled in response to the channel representative magnitude of a tuning voltage (TV). Mixer 50 combines (heterodynes) the selected and amplified RF signal and the local oscillator signal to produce sum and difference frequency components. IF section 60 separates the difference frequency component from the sum frequency component to produce the IF signal.

IF section 60 also amplifies the IF signal and demodulates its modulated picture and sound carriers to produce baseband video and audio signals. In addition, IF section 60 produces an automatic gain control (AGC) signal representing the amplitude of the IF signal and an automatic fine tuning (AFT) signal representing the deviation, if any, between the frequency of the picture carrier of the IF signal and a nominal frequency value (e.g., 45.75 MHz in the U.S.). The AGC signal is used to control the gain of RF amplifier 20 and an amplifier within IF section 60 so that the IF signal has a desired level. The AFT signal is used as will be described below in producing the tuning voltage (TV).

Channels are selected for tuning by means of a channel selector 70. Channel selector 70 may, for example, include a keyboard by which the channel number of the desired channel can be entered by a user and digital circuitry for generating a channel number representative digital signal. The channel number representative digital signal is coupled to a tuning voltage generator 80, e.g., including a phase-locked loop, which generates the tuning voltage (TV) and controls its magnitude in response to the channel number of the desired channel. Tuning voltage generator 80 also controls the magnitude of the tuning voltage in response to the AFT signal to reduce any deviation between the frequency of the picture carrier of the IF signal and its nominal frequency value. The tuning voltage is also coupled to a VHF section (not shown) of the tuner. In addition to generating the tuning voltage, tuning voltage generator 80 also controls the activation of the UHF and VHF tuner sections depending on the channel number of the channel selected for tuning by selectively applying a supply voltage (B+) to the appropriate tuner section.

Having described the general arrangement of the UHF tuner section, RF input circuit 10, RF amplifier 20 and RF output section 30 will be described in detail.

RF signal input circuit 10 includes antenna connection terminals 11a and 11b to which the conductors of a twin-lead or balanced transmission line (not shown), for coupling the RF signals received by the UHF antenna (not shown) to the UHF tuner section, can be connected. Two high valued resistors 12a (e.g., 1.8 megohms) and 12b (e.g., 1.8 megohms) are connected in series between antenna connection terminal 11b and ground (by means of a connection to a grounded shield enclosure not shown). Resistors 12a and 12b serve to discharge any charge developed at antenna connection terminals 11a and 11b, which are exposed to users.

A balun transformer 13 for coupling the balanced impedance configuration of the antenna input arrangement to the unbalanced impedance configuration of RF amplifier 20 includes a primary 13a and a secondary 13b. Primary 13a comprises a coil of wire (e.g., exhibiting 35 nanohenries of inductance) and is connected between antenna connection terminals 11a and 11b. Secondary 13b comprises a conductor strip, indicated by the rectangle, suitable for exhibiting an inductance (e.g., 14 nanohenries) in the UHF range. Secondary 13b includes an adjustable element (not shown in FIG. 1) for adjusting its inductance value as will be described below.

A varactor diode 14 and secondary inductor 13b are connected in series, in the order named, between signal ground and the input of RF amplifier 20 (at a first gate electrode G1 of a field-effect transistor 21) and comprise a series-tuned circuit 15. The tuning voltage is coupled to the cathode of varactor diode 14 through a filter/isolation network 16, including a shunt connected filter capacitor 16a (e.g., 470 picofarads) and a series-connected isolation resistor 16b (e.g., 22 kilohms), and inductor 13b. Varactor diode 14 may comprise a type 1SV153 varactor diode available from Toshiba. A suitable tuning voltage for the disclosed embodiment may vary between +1 volt and +30 volts producing a corresponding varactor capacitance variation between 15 and 1.5 picofarads.

A large valued coupling capacitor 17 (e.g., 470 picofarads) couples the RF signal selected by series-tuned circuit 15 to the input of RF amplifier 20 (at first gate G1 of FET 21) while preventing the tuning voltage from affecting its DC operating condition.

Series-tuned circuit 15 is utilized rather than a parallel tuned circuit because it exhibits a more nearly uniform bandwidth as a function of frequency as explained above.

A capacitor 18 (e.g., 10 picofarads) is coupled in shunt with series-tuned circuit 15 and with the input of RF amplifier 20. Varactor 14 and shunt-connected capacitor 18 form a variable capacitive voltage divider which serves as a variable impedance transformation network for causing the relationship between the impedance presented by series-tuned circuit 15 and the impedance presented by FET RF amplifier 20 to be relatively uniform through the UHF range in a manner somewhat similar to that of the conventional "split-capacitor" arrangement described above. However, the present split-capacitor UHF RF signal input circuit is specifically arranged to provide significant advantages over the conventional split-capacitor UHF RF signal input circuit as will be described below. Desirably, resistive portions of the impedances of FET amplifier 20 and series-tuned circuit 15 will have a ratio at least approximately 4/1 and the reactive portions will be at least approximately equal in magnitude but opposite in sign uniformly throughout the UHF range. This provides optimum noise performance with relatively good power gain.

RF input circuit 10 is significantly different from the conventional "split-capacitor" arrangement described above in that it allows a relatively inexpensive adjustable trimming capacitor 19a to be connected directly across (i.e., in parallel with) varactor diode 14. Adjustable trimming capacitor 19a is inexpensive because it simply includes a movable tab as a first plate and a wall of a grounded shield enclosure as a second plate. The capacitance of capacitor 19a is adjusted by moving the tab relative to the shield wall. Adjustable trimming capacitor 19a is adjusted to align the center frequency of tuned circuit 15 in the upper frequency end of the UHF range.

A preferred unitary tuning structure incorporating the inductor 13b, the inductance adjusting element of inductor 13b, and the capacitance adjusting tab of capacitor 19b will be described in detail with respect to FIGS. 2 and 3. The unitary tuning structure is indicated in FIG. 1 by the dotted line enclosure.

It is noted that if the locations of varactor diode 14 and inductor 13b were reversed, adjustable capacitor 19a, having one plate connected to ground, would not be connected directly across varactor diode but would instead be connected directly across inductor 13b and also across the series combination of varactor diode 14 and capacitor 18. Accordingly, in the latter case, adjustment of capacitor 19a would not have a direct effect on the capacitance of the series-tuned circuit but would rather have an indirect and more complex effect.

Tests have indicated that the present split-capacitor arrangement shown in FIG. 1 produces a ratio between the resistive portions of the impedances of FET amplifier 20 and the series-tuned circuit 15 which is more uniform as a function of frequency than that for the conventional split-capacitor arrangement in which the locations of varactor diode 14 and inductor 13b would be reversed. It is believed that the more uniform ratio produced by the present arrangement shown in FIG. 1 results because adjustable capacitor 19a is connected directly across varactor diode 14 (rather than across inductor 13b and the series combination of varactor diode 14 and capacitor 18) and therefore directly affects the capacitive-voltage divider impedance transformation network. The effect is to increase the equivalent parallel impedance presented by the combination tuned circuit 15 and capacitor 17 at the upper frequency end of the UHF range. If the locations of varactor diode 14 and inductor 13b were reversed, adjustable trimming capacitor 19a would be across the series combination of varactor diode 14 and capacitor 18 and therefore would not directly affect the capacitive voltage divider impedance transformation network.

The location of varactor diode 14 between inductor 13b and signal ground causes inductor 13b to be ungrounded which may tend to cause the thus ungrounded inductor 13b to develop stray capacitances which, in turn, may cause RF input circuit 10 to be sensitive to the position and movement of the covers of the tuner enclosure. However, this potential problem is outweighed by the advantage of being able to connect adjustable trimming capacitor 19a directly across varactor diode 14.

It has been found desirable to connect a fixed capacitor 19b (e.g., 0.5 picofarads) in parallel with varactor diode 14 for the following reasons. As indicated above, the second plate of adjustable trimming capacitor 19a is the wall of a grounded shield enclosure. Accordingly, adjustable capacitor 19a is indirectly connected to signal ground through the shield enclosure. It has been found that such indirect connection to signal ground may cause so-called "ground loop" currents to flow to RF input circuit 10 which, in turn, may cause undesired regenerative (i.e., oscillatory) modes of operation to be established. To inhibit such regenerative modes of operation, capacitor 19a is directly connected between the junction of varactor diode 14 and inductor 13b and signal ground to divert shield ground loop currents directly to signal ground. Capacitor 19b also affects the tuning range of tuned circuit 15.

RF amplifier 20 includes a dual-gate MOS (metal-oxide semiconductor) field-effect transistor (FET) 21, having a first gate electrode G1, a second gate electrode G2, a source electrode S and a drain electrode D, is connected in a "common source" configuration. FET 21 may be a type BF996R FET available from Siemens of West Germany. The RF signal selected by RF input circuit 10 is coupled to first gate electrode G1. The output signal of RF amplifier 20 is developed across a load inductor 22 (e.g., 36 nanohenries) connected between drain electrode D and the source of positive supply voltage B+ (e.g., +12 voltage). A first voltage divider, including a resistor 23a (e.g., 56 kilohms) and a resistor 23b (e.g., 33 kilohms), develops a bias voltage for first gate electrode G1 from positive supply voltage B+. A second voltage divider, including a resistor 24a (e.g., 1500 ohms) and a resistor 24b (e.g., 270 ohms), develops a bias voltage for source electrode S. Source electrode S is effectively connected to signal ground for RF signals through a relatively large value capacitor 25 (e.g., 470 picofarads). The automatic gain control (AGC) voltage is coupled to second gate electrode G2 through a lowpass filter including a series resistor 26 (e.g., 2.2 megaohms), a shunt capacitor 27 (e.g., 470 picofarads) and a series resistor 28 (e.g., 51 ohms). The output signal developed at drain electrode D is coupled through a capacitor 29 (e.g., 1.5 picofarads) to tuned RF output circuit 30. The values of inductor 22 and capacitor 29 are selected to form an impedance transformation network between the output of RF amplifier 20 at drain electrode D and tuned RF output circuit 30, in the manner described in detail in U.S. Pat. No. 4,048,598 of Knight entitled "UHF Circuit Utilizing a Varactor Diode"

Tuned RF output circuit 30 includes two magnetically-coupled parallel-tuned circuits 31a and 31b.

Parallel-tuned circuit 31a includes a conductor strip inductor 32a (e.g., 16 nanohenries) and a varactor diode 33a. Inductor 32a is connected between signal ground and the anode of varactor diode 33a and the cathode of varactor diode 33a is connected to ground through a capacitor 34a (e.g., 18 picofarads). Inductor 32a is adjustable. An adjustable trimming capacitor 35a is connected between the junction of inductor 32a and varactor diode 33a and signal ground and thereby in parallel with inductor 32a and also the series combination of varactor diode 33a and capacitor 34a. Inductor 32a, an adjustable inductance element of inductor 32a, and a capacitance adjusting tab of capacitor 35a is preferably part of a unitary tuning structure indicated by the dotted line enclosure similar to that used in RF input circuit 10 as will be described below in detail. The output of RF amplifier 20 is connected through capacitor 29 to the junction of inductor 32a and varactor diode 33a.

Parallel-tuned circuit 31b is similar to parallel-tuned circuit 31a and therefore has correspondingly identified components. Inductor 32a of parallel-tuned circuit 31a is magnetically-coupled to inductor 32b of parallel-tuned circuit 31b. Inductor 32b has a slightly higher inductance (e.g., 17 nanohenries) compared with the inductance (e.g., 16 nanohenries) of inductor 32a and capacitor 34b has a slightly a lower capacitance (e.g., 15 picofarads) compared with the capacitance (e.g., 18 picofarads) of capacitor 34a. A low valued capacitor 36 (e.g., 1.5 picofarads), having no corresponding element in tuned circuit 31a, is connected in parallel with varactor diode 33b.

The tuning voltage (TV) is coupled through a network including shunt-connected filter capacitor 37a (e.g., 470 picofarads) and a series-connected isolation resistor 37b (e.g., 22 kilohms) to the cathode of varactor diode 33b and additionally through a large valued inductor 38 (e.g., 150 nanohenries) to the cathode of varactor diode 33a. Inductor 38 also serves to provide a secondary coupling path between tuned circuits 31a and 31b at the low frequency end of the band.

An inductor loop 39, magnetically coupled to inductors 32a and 32b, is provided to couple the RF signal selected by double-tuned circuit 30 to mixer 50. A desirable construction of inductor loop 39 as part of a unitary structure including inductor 32b, the inductance adjustment element of inductor 32b, and the capacitance adjustment tab of capacitor 35b will be described below with reference to FIG. 4.

The location of inductor loop 39 relative to inductor 32b and inductor 32a can be adjusted to form an unwanted signal trap which tracks the frequency response of double tuned circuit 30 to select the desired RF signal as a function of frequency in response to the tuning voltage. Basically, the trap is formed because inductor loop 39 is magnetically coupled to inductor 32b and to a lesser degree to inductor 32a and thereby to varactor diodes 33b and 33a and capacitors 34b and 34a. The position of loop 39 can be adjusted relative to inductors 32a and 32b, as will be described below, to effect a cancellation between the signals received from tuned circuits 31a and 31b at an interference frequency above the resonant frequency of double-tuned circuit 30.

It is desirable to set the trap made available by inductor loop 39 so that so-called image frequency signals are rejected. Image frequency signals are those RF signals with frequencies of about 45.75 MHz (i.e., the nominal frequency of the IF picture carrier) above the local oscillator frequencies. Image frequency signals can produce interference because mixer 50 can produce difference frequency components corresponding to IF picture carriers both from the desired RF signal for the selected channel, which has a frequency of 45.75 MHz below the frequency of the local oscillator signal for selected channel, and from the image RF signal, which has a frequency 45.75 above the frequency of the local oscillator signal for the selected channel.

Parallel-tuned circuits are used in RF output circuit 30 rather than series-tuned circuits because it was found easier to obtain both the desired impedance transformation between the output of RF amplifier 20 and tuned circuit 30 and the desired tracking between the frequency selective response of RF output circuit 30 and the frequency selective response of RF input circuit 10. More specifically, if a series-tuned circuit and split-capacitor impedance transformation arrangement were used, a shunt capacitor, corresponding to shunt capacitor 18 of RF input circuit 10, would have to have a relatively low value (e.g., 6 picofarads as compared with 10 picofarads used in RF input circuit 10) to compensate for the higher output impedance presented at drain D compared with the input impedance presented at first gate electrode G1. Lowering the capacitance of the shunt capacitor limits the tuning range of the effective capacitance element of the tuned circuit because the varactor diode is in series with the shunt capacitance element. As a result, tracking can be impaired.

The tuned circuit of local oscillator 40 desirably also includes a series-tuned circuit including a varactor diode and an inductor connected in series, in the order named, between signal ground and the input of an amplifier in the same manner as series-tuned circuit 15 of RF input circuit 10. The amplifier may comprise a common collector amplifier with the base electrode capacitively coupled to the series-tuned circuit. A mixer output signal can be obtained by magnetically coupling a coil to the inductor of the tuned circuit. Another output signal, e.g., for a phase-locked loop, can be obtained from the emitter circuit. Preferably a unitary tuning structure, including the inductor of the tuned circuit, an inductance adjusting element for the inductor, and a capacitance adjusting tab of an adjustable capacitance connected directly across the inductor, is constructed in the same manner as the unitary tuning structures of RF input circuit 10 and RF output circuit 20 to be described below with reference to FIGS. 2 and 3.

The preferred physical structures of the various tuned circuits described above in terms of electrical connections will now be described with reference to FIGURES 2, 3 and 4.

Figure 2:
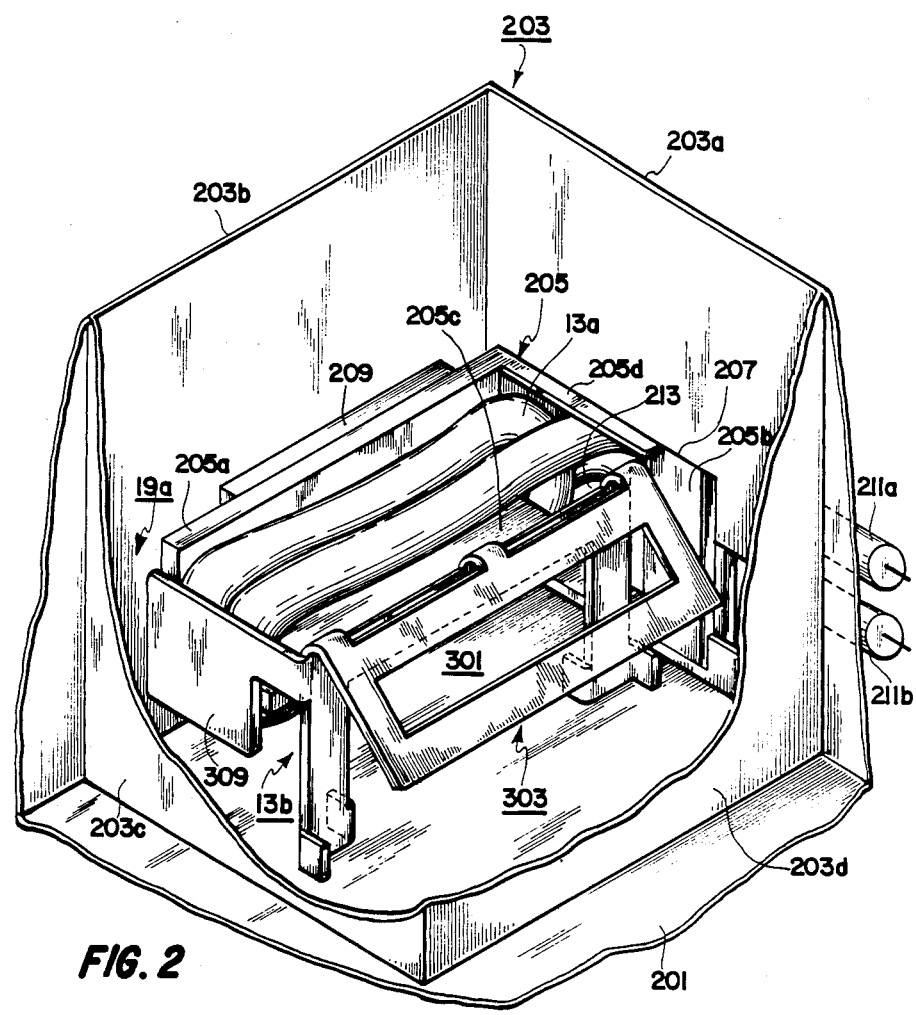
FIG. 2 is an isometric view of a portion of the UHF tuner section shown in FIG. 1 using a unitary tuning structure constructed in accordance with the present invention.

FIG. 2 shows a portion of the physical structure of tuned circuit 15. The elements of tuned circuit 15 are mounted on the top surface (i.e., the surface shown) of a printed circuit board 201 and are connected by conductors (not shown) formed on the bottom surface. The elements such as varactor diode 14, capacitor 18, fixed capacitor 19b, etc., that are mounted on printed circuit board 201 have been omitted from the FIGURE for simplicity. A shield enclosure 203, including four wall members 203a, 203b, 203c and 203d, surrounds tuned circuit 15. Wall members 203a comprise a portion of an outer tuner housing. A top cover and a bottom cover (which is beneath printed circuit board 201) of the tuner are not shown. The tuner housing, shield enclosures 203, and the tuner covers are made from sheet steel.

Primary coil 13a of balun transformer 13 comprises a complete loop of insulated wire. Coil 13b is mounted on a coil support 205 having an L-shaped configuration with a long leg member 205a and a short leg member 205b which are perpendicular to one another. Coil 13a is wound around a tab 205c which extends from and is perpendicular to long leg member 205a. Long leg member 205a short leg member 205b, and tab 205c are a part of a unitary molded plastic structure comprising coil support 205.

During assembly of the tuner, coil support 205, with coil 13a in place, is inserted through a rectangular aperture 207 in shield wall 203a until tabs (only top tab 205d is visible) of short leg 205b engage the edge of rectangular aperture 207 as shown. Once in place, coil support 205 is attached to shield wall 203b by a piece of double sided tape comprising a resilient pad 209 with adhesive on both sides. Ends 211a and 211b of the wire from which coil 13a is formed extend through a rectangular aperture 213 within short leg member 205b of coil support 205 and thereby through aperture 207 of shield wall 203a. Ends 211a and 211b are connected to respective antenna connection terminals (11a and 11b shown in FIG. 1) mounted on a plastic antenna block (not shown) which is in turn mounted on shield wall 203a of the tuner housing. Isolation resistors 12a and 12b can be connected between antenna connection terminal 11b and shield wall 203a.

Desirably, the wire from which coil 13a is formed is insulated with PVC (poly-vinyl-chloride). The PVC insulation prevents high voltage breakdown between the conductors of the wire and the housing of the tuner. This is particularly desirable in a "hot chassis" receiver in which the chassis is directly connected to an AC power return line because high AC voltages may be applied to the chassis and thereby to the housing of the tuner if the AC ground line is somehow accidentally disconnected from the AC return line. Such high AC voltages could reach antenna terminals 11a and 11b through a break in the insulation in the wire from which coil 13a is formed if coil 13a were made in more conventional fashion from enamel insulated wire. If enamel insulated wire were used, high voltage coupling capacitors connected between respective ones of antenna terminals 11a and 11b would be required. The capacitors are avoided in the present arrangement. While the use of PVC insulated wire tends to reduce the magnetic coupling, in the present arrangement because secondary 13b of the balun 13 is vertically oriented rather than horizontally oriented with respect to the grounded bottom tuner cover, sufficient magnetic coupling is achieved. A 22 gauge PVC insulated wire has been found to produce good results.

As noted above, inductor 13b, an inductance adjusting element of inductor 13b and the adjustable tab comprising one plate of adjustable trimming capacitor 19a are preferably part of a unitary tuning structure. This unitary tuning structure will now be described with reference to FIGS. 2 and 3. In FIG. 2, the structure is shown in "folded" form as is employed in the tuner. In FIG. 3, the structure is shown in "unfolded" form before it is incorporated in the tuner.

Figure 3:
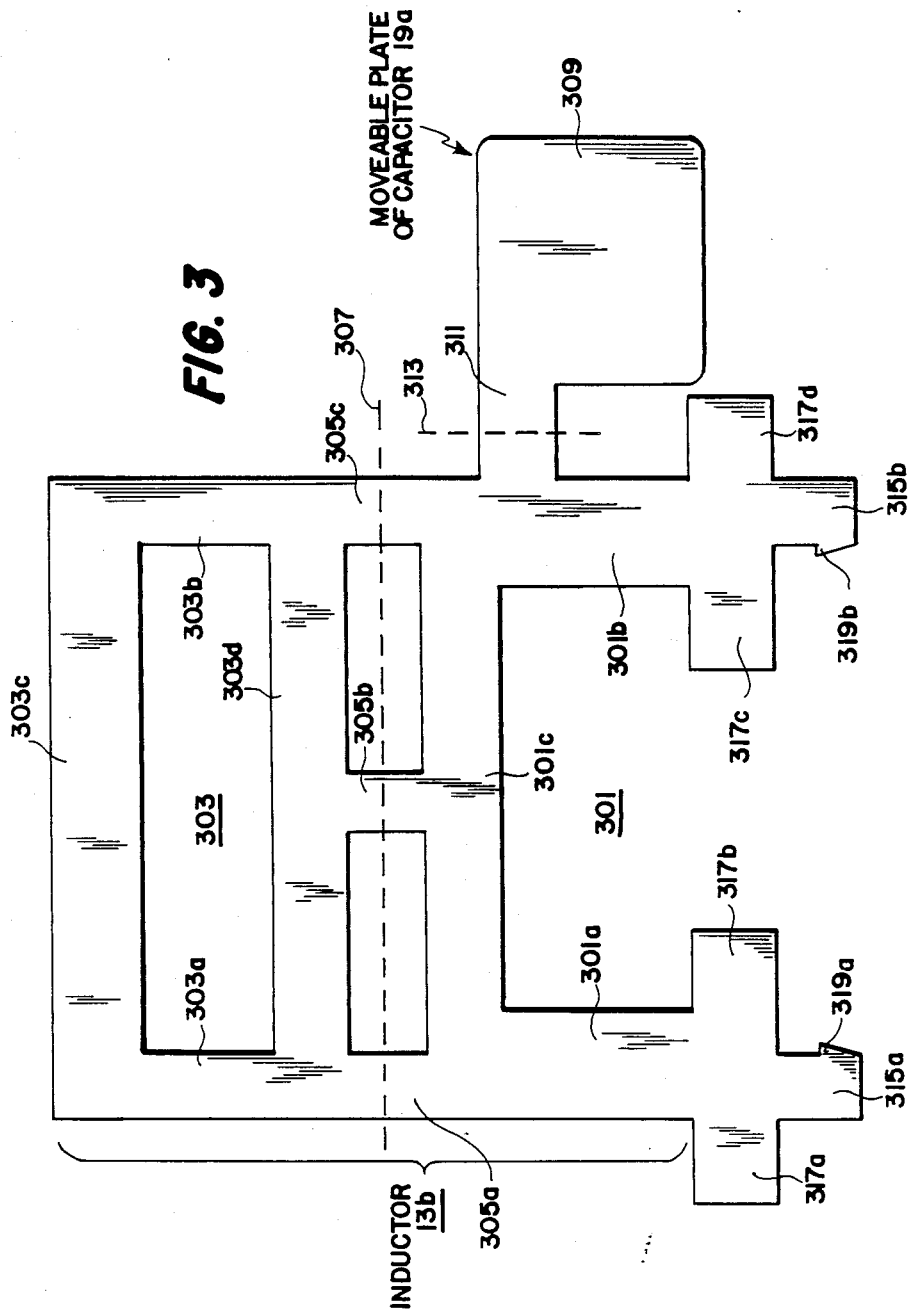
FIG. 3 is a plan view of a unitary tuning structure employed in the portion of the UHF tuner section shown in FIG. 2.

Referring to FIG. 3, the unitary structure is stamped from a soft copper sheet metal (e.g., 0.015 inches thick). Inductor 13b includes a main loop 301 and an adjusting element 303 also comprising a loop in this embodiment. Main inductor loop 301 and inductance adjusting loop 303 are joined by three bendable straps 305a, 305b and 305c so that adjusting loop 303 may be folded over with respect to the plane of main loop 301 about an axis 307 perpendicular to straps 305a, 305b and 305c, as is shown in FIG. 2.

Main loop 301 is rectangular and includes a left-side conductor strip 301a, a right-side conductor strip 301b and a top conductor strip 301c bridging and perpendicular to side conductor strips 301a and 301b. Inductance adjusting loop 303 is also rectangular and includes a left-side conductor strip 303a, a right-side conductor strip 303b, a top conductor strip 303c bridging and perpendicular to conductor strips 303a and 303b and a bottom conductor strip 303d also bridging and perpendicular to conductor strips 303a and 303b. Unlike main loop 301, adjusting loop 303 is closed. Straps 305a, 305b and 305c extend between and are perpendicular to top section 301c of main loop 301 and bottom section 303d of adjusting loop 303.

A rectangular tab 309, comprising the moveable plate of adjustable trimming capacitor 19a, is attached to right conductor strip 301b of main loop 301. Strap 311 is bendable so that tab 309 can be folded over with respect to the plane of loop 301 about an axis 313 and positioned relative to a shield-wall (e.g., shield wall 203c as is shown in FIG. 2). Axis 307 associated with adjustable inductor 13b is perpendicular to axis 313 associated with adjustable capacitor 19b.

Extensions of side conductor strips 301a and 301b form connection terminals 315a and 315b which are inserted through mating slots of printed circuit board 201 and which are soldered to printed circuit conductors surrounding the slots during the assembly of the tuner. A pair of tabs 317a and 317b extending perpendicularly from side conductor strip 301a of main loop 301 and a pair of tabs 317c and 317d extending perpendicularly from side conductor strip 301b are bent in opposite directions with respect to the plane of main loop 301 during assembly. Bent tabs 317a, 317b, 317c and 317d support the unitary tuning structure so that the plane of main loop 301 is perpendicular to the printed circuit board 201 as shown in FIG. 2. Barbs or hooks 319a and 319b extending laterally from respective terminals 315a and 315b grip the bottom of the printed circuit board and thereby help hold the unitary structure in the slots during wave soldering.

Bent tabs 317a, 317b, 317c and 317d are desirable because the unitary structure does not have to be held perpendicular to printed circuit board 201 during soldering and can, therefore, be readily attached to the printed circuit board by wave soldering. In addition, bent tabs 317a, 317b, 317c and 317d provide rigidity to main loop 301 so that it is not significantly disturbed as the angular positions of auxiliary loop 303 and tab 309 are adjusted as will be described below. Bent tabs 317a, 317b, 317c and 317d are also desirable since they tend to inhibit mechanical vibrations of the unitary structure which may tend to produce corresponding variations in the frequency response of the tuned circuit. Such affects are sometimes called "micro-phonics."

Referring now to FIG. 2, again, the adjustment of the capacitance of capacitor 19a and the inductance of inductor 13b will be described in detail.

As was earlier indicated with reference to FIG. 1 and is specifically shown in FIG. 2, adjustable trimming capacitor 19a, comprises tab 309 as a first plate and grounded shield wall 203c as a second plate. The capacitance of capacitor 19a is adjusted by changing the angular position of tab 309 relative to shield wall 203c. As tab 309 is brought closer to shield wall 203c from the generally parallel position shown, the capacitance of capacitor 19a increases. With the exemplary dimensions indicated below, adjustable capacitor 19a exhibits a capacitance approximately between 0.1 and 0.5 picofarads which results in about 5% frequency adjustment at the high end of the UHF band (where the capacitance of the varactor diode is the lowest) and a 0.5% frequency adjustment at the lower end (where the capacitance of the varactor is the highest).

The inductance of inductor 13b is adjusted by changing the angular position of the plane of adjusting loop 303 relative to the plane of main loop 301. As the plane of adjusting loop 303 is brought closer to the plane of loop 301, the inductance of inductor 13b decreases. The maximum inductance is exhibited when adjusting loop 303 is in the same plane as main loop 301 (as is the case before folding as shown in FIG. 3).

With the exemplary dimensions indicated below, the inductance of inductor 13b can be adjusted to produce approximately a 4% frequency adjustment through the UHF band. It is believed that adjusting loop 303 acts as a shorted secondary of a transformer having main loop 301 as the primary. As auxiliary loop 303 is brought closer to main loop 301, the magnetic coupling between the loops increases and the effect of the shorted secondary increases, thereby decreasing the effective inductance of inductor 13b. Another way of understanding how the inductance of inductor 13b is adjusted is to simply consider that adjusting loop 303 interferes more with the magnetic field of main 301 the closer it is to main loop 301.

While adjusting element 303 of inductor 13b has been shown and thus far described as comprising a loop, it has been found that it may be a solid tab as well with respect to electrical characteristics of inductor 13b. However, it is preferred that adjusting element 303 be a loop as shown in FIGS. 2 and 3 because the aperture of the loop allows for the engagement of adjustment tools from a variety of positions.

Certain advantages over prior unitary tuning structures arise because of the folding or adjustment of axis 307 of inductor 13b and 313 of capacitor 19b in parallel to the plane of printed circuit board 201. These advantages will now be described.

Prior unitary structures somewhat similar to the present one comprise: an inductor section including two side conductor strips with connection terminals at their lower ends and a top conductor strip arranged in a rectangular fashion; an inductance adjusting section including a rectangular loop attached to the lower part of one of the side conductor strips of the inductor section by a bridging conductor strip; and a capacitance adjusting section including a tab attached to the other side conductor strip of the inductor section. The structure is folded so that when it is initially installed in a tuner the bridging conductor strip is bent to be perpendicular to the plane of the main inductor loop and the inductance adjusting loop is bent to be perpendicular to the bridging conductor strip so that the plane of inductance adjusting loop is parallel to the plane of the main inductor loop (i.e., as viewed from above, the main inductor loop, bridging conductor strip and inductance adjusting loop form a U-shaped configuration). The inductance adjusting section has a downward extending connection terminal for holding it in a generally parallel relationship with the main loop in the final assembly. The capacitance adjusting tab is bent to be in the plane perpendicular to the plane of the main inductor loop. From the initial configuration, the free corner of the inductance adjusting loop can be bent toward or away from the plane of the main inductor loop to adjust the inductance of the inductor; and the capacitance adjusting tab can be bent toward or away from a shield wall of the tuner to adjust the capacitance of the associated capacitor.

The prior arrangement has several disadvantages. First, the inductance adjusting element requires two right-angle bends. Second, location of components on the printed circuit board near the plane of the main inductor loop is restricted due to the parallel arrangement of inductance adjusting loop. Third, the main inductor and inductance adjusting loop tend to act like separate structures under vibration although they comprise parts of a unitary structures. This tends to produce microphonics.

The above disadvantages are overcome by the present unitary tuning structure. Only one bend is needed for the inductance adjusting element 303 and that can be performed during the final inductance adjustment. Since inductance adjustment element 303 extends upward from main inductor loop 301 and is folded about an axis parallel to the plane of the printed circuit board (rather than an axis perpendicular to it) it does not require room on the printed circuit board and can be adjusted without concern about possibly obstructing elements on the printed circuit board. Inductance adjustment element 303 is not as subject to vibration relative to main inductor loop 301 compared with the inductance adjustment element of the prior arrangement and is therefore less likely to produce microphonics. Finally, comparative tests have indicated that the present arrangement provides a greater inductance adjustment than the prior arrangement. This is believed due to the ability to bend adjustment element 303 relatively close to main inductor loop 301.

The unitary tuning structures of tuned circuits 31a and 31b of RF output stage 30 may be formed in the same way shown in FIGS. 2 and 3. Since tuned circuits 31a and 31b are intended to be magnetically coupled, main inductor loops 301 of the respective tuned circuits are mounted so that their planes are parallel. Respective adjustment elements 303 and tabs 309 of the two tuned circuits desirably will be bent in opposite directions so as to allow adjustment without interference from the opposing unitary tuning structure. In the case where it is desirable to locate tuned circuits 31a and 31b within different shield enclosures for isolation, the unitary tuning circuits can be mounted on opposite sides of an aperture (e.g., a rectangular aperture) within a common shield wall. The unitary tuned circuits can be laterally positioned with respect to the aperture to set a desired degree of coupling.

Figure 4:
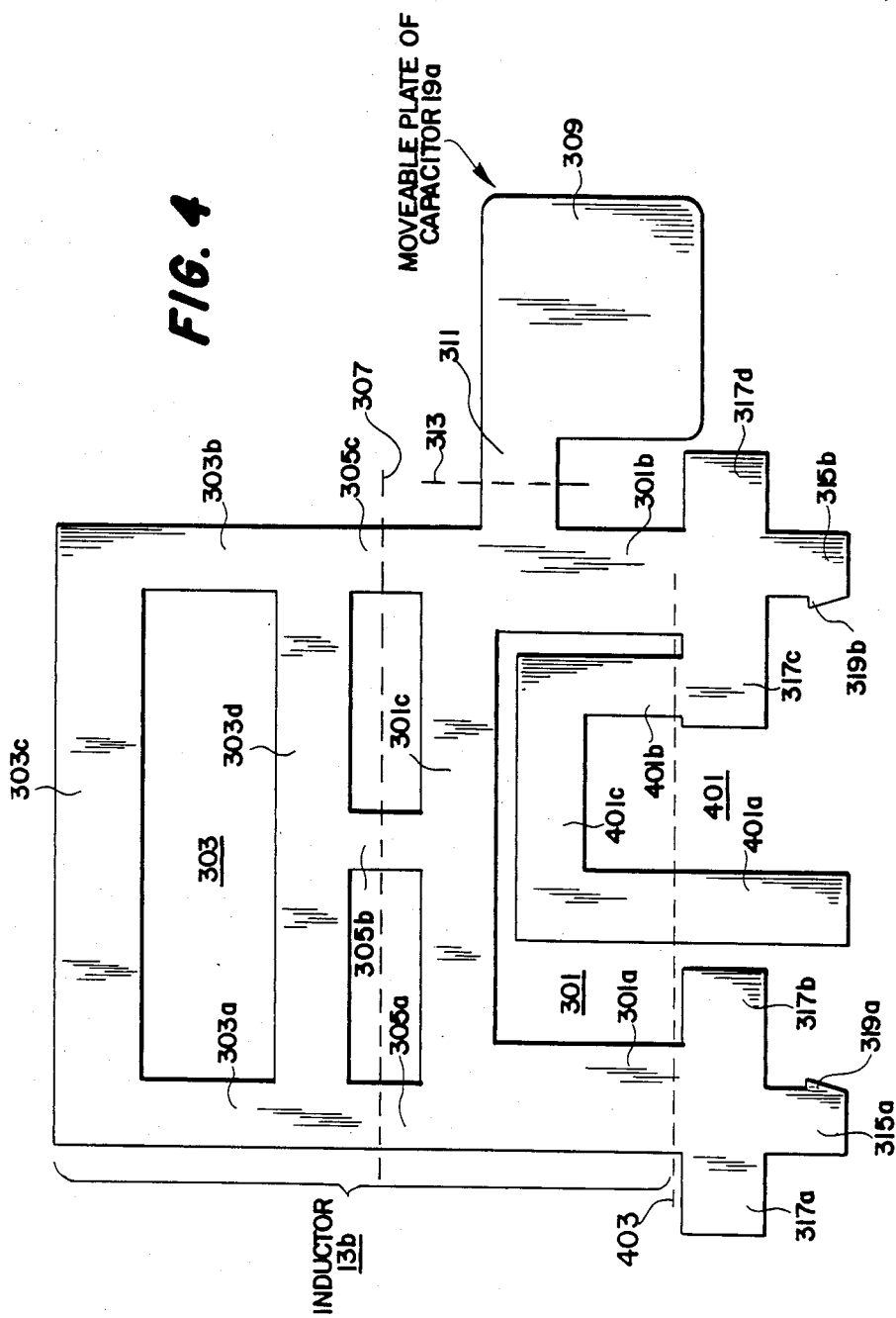
FIG. 4 is a plan view of another unitary tuning structure constructed in accordance with the present invention employed in the UHF tuner section shown in FIG. 1.

FIG. 4 shows a modification to the unitary tuning structure shown in FIGS. 2 and 3 for forming a signal trap such as is associated with tuned circuit 30. The modifications include the addition of another rectangular inductor loop 401 within main inductor loop 301. For example, inductor loop 301 corresponds to inductor 32b and inductor loop 401 corresponds to loop 39 of the tuner shown in FIG. 1. Additional loop 401 includes left side conductor strip 401a, right side conductor strip 401b and top conductor strip 401c. Right side conductor strip 401b extends upward from mounting tab 317c. Left side conductor strip 401a is long enough to extend through a slot within the associated printed circuit board where it is soldered to a printed circuit board conductor to provide the RF signal output signal. Left side conductor strip 401a does not include tabs such as 317a and 317b because there is insufficient room.

In the assembled tuner, the plane of trap loop 401 is angularly positioned away from the plane of main inductor loop 301 about an axis 403 extending through the ends of side conductor strips 301a and 301b of main inductor loop 301 to adjust the trap frequency.

The unitary tuning structure shown in FIG. 4 including the output coupling and trap loop has advantages over prior arrangements in which a separate loop of wire was used for the following reasons. The separate loop increased the difficulty because of the required proximity between the output coupling and trap loop and the main loop. The use of a separate loop also tended to produce variation from unit to unit and therefore cost of assembly. These disadvantages are avoided with the present arrangement. The unitary structure also tends to reduce microphonic tendencies present in the prior arrangement.

Exemplary dimensions (in inches) for the unitary tuning structures shown in FIGS. 2 and 3 are indicated in the following table.

| CONDUCTOR STRIP | LENGTH | WIDTH |
| --- | --- | --- |
| 301a and 301b | 0.325 | 0.080 |
| 301c | 0.442 | 0.060 |
| 303a and 303b | 0.225 | 0.050 |
| 303c | 0.462 | 0.065 |
| 303d | 0.462 | 0.060 |
| 305a, 305b and 305c | 0.100 | 0.050 |
| 309 (for tuned circuits 15 and 31b) | 0.225 | 0.225 |
| 309 (for tuned circuit 31a) | 0.175 | 0.175 |
| 311 | 0.110 | 0.050 |
| 401a | 0.335 | 0.060 |
| 401b | 0.235 | 0.060 |
| 401c | 0.150 | 0.060 |
| gap between 401a and 301a | — | 0.080 |
| gap between 401b and 301b | — | 0.030 |
| gap between 401c and 301c | — | 0.020 |

What is claimed is:

1. Tuner apparatus comprising:
   a circuit board including conductors for connecting elements mounted on said circuit board;
   a unitary tuning structure stamped integral form from the same piece of sheet metal and including, as integral portions, an opened inductance loop, ends of said inductance loop having terminals soldered to repective ones of said conductors of said circuit board for electrically connecting and for structurally attaching said unitary tuning structure to said circuit board, said unitary tuning structure being attached to said circuit board so that the plane of said inductance loop is directed upward from said circuit board; and an inductance adjusting element bendably attached to a top portion of said inductance loop so that the plane of said inductance adjusting element is angularly positionable with respect to the plane of said inductance loop about an axis which is at least generally parallel to said circuit board.

2. The tuner apparatus recited in claim 1, werein:
   said inductance adjusting element is a closed inductance loop.

3. The tuner apparatus recited in claim 1, wherein:
   a shield wall perpendicular to said circuit board is located proximate to said unitary tuning structure; and
   said unitary tuning structure further includes, as an integral portion, a capacitance adjusting tab bendably attached to a side portion of said inductance loop so that the plane of said tab is angularly positionable with respect to said shield wall about an axis at least generally parallel to said shield wall.

4. The apparatus recited in claim 1, wherein:
   said unitary tuning structure further includes, as an integral portion, a second opened inductance loop having a first end attached to a side portion of said first-mentioned inductance loop and a second end having a terminal soldered to a conductor of said circuit board, the plane of said second loop being angularly positionable with respect to the plane of said first inductance loop starting from a position underneath said first inductance loop and in its plane about an axis intersecting said first and second ends of said first inductor loop.

5. The apparatus recited in claim 1, wherein:
   said inductance loop is rectangular.

6. The apparatus recited in claim 1, wherein:
   said second inductance loop is rectangular.

7. The apparatus recited in claim 1, wherein:
   said unitary tuning structure further includes, as integral portions, tabs attached to the ends of said inductance loop and bent away from the plane of said inductance loop to support said unitary tuning structure on said circuit board so that the plane of said inductance loop is substantially perpendicular to said circuit board.

8. Tuner apparatus comprising:
   a circuit board including conductors for connecting elements mounted on said circuit board;

a unitary tuning structure stamped from the same piece of sheet metal and including, as integral portions, a first opened inductance loop, ends of said first inductance loop having terminals soldered to respective ones of said conductors of said circuit board for electrically connecting and for structurally attaching said unitary tuning structure to said circuit board, said unitary tuning structure being attached to said circuit board so that the plane of said first inductance loop is directed upward from said circuit board; an inductance adjusting element bendably attached to a top portion of said first inductance loop so that the plane of said inductance adjusting element is angularly positionable with respect to the plane of said first inductance loop about an axis which is at least generally parallel to said circuit board; and a second opened inductance loop having a first end attached to a side portion of said first-mentioned inductance loop and a second end having a terminal soldered to a conductor of said circuit board, said second loop being angularly positionable with respect to the plane of said first inductance loop starting from a position underneath said first inductance loop and in its plane about an axis intersecting said first and second ends of said first inductor loop.

9. The apparatus recited in claim 8, wherein: said first and second inductance loops are rectangular.

10. The apparatus recited in claim 9, wherein:

said unitary tuning structure further includes, as integral portions, tabs attached to the ends of said first inductance loop, at least one of said tabs being bent away from the plane of said first inductance loop to support said unitary tuning structure on said circuit board so that the plane of said first inductance loop is substantially perpendicular to said circuit board; and said second inductance loop is attached to another one of said tabs attached to said ends of said first inductance loop.

* * * * *

UNITED STATES PATENT AND TRADEMARK OFFICE
CERTIFICATE OF CORRECTION

PATENT NO. : 4,851,798

DATED : 7-25-89

INVENTOR(S) : Alexander W. Hietala, et al.

It is certified that error appears in the above-identified patent and that said Letters Patent is hereby corrected as shown below:

Column 7, line 26, after "203a" and before "comprise" insert -- and 203b --;

Column 12, line 56 (Claim 6), that portion reading "1" should read -- 4 --.

Signed and Sealed this

Eighteenth Day of September, 1990

Attest:

HARRY F. MANBECK, JR.

*Attesting Officer*  *Commissioner of Patents and Trademarks*